(12) United States Patent
De Jaeger et al.

(10) Patent No.: US 9,634,107 B2
(45) Date of Patent: Apr. 25, 2017

(54) LOW TEMPERATURE OHMIC CONTACTS FOR III-N POWER DEVICES

(71) Applicant: IMEC, Leuven (BE)

(72) Inventors: Brice De Jaeger, Leuven (BE); Marleen Van Hove, Blanden (BE); Stefaan Decoutere, Leuven (BE); Steve Stoffels, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/285,080

(22) Filed: May 22, 2014

(65) Prior Publication Data

US 2014/0346568 A1 Nov. 27, 2014

(30) Foreign Application Priority Data

May 22, 2013 (EP) ..................... 13168720
Jan. 21, 2014 (EP) ..................... 14151939

(51) Int. Cl.
*H01L 29/45* (2006.01)
*H01L 21/285* (2006.01)
(Continued)

(52) U.S. Cl.
CPC ...... *H01L 29/454* (2013.01); *H01L 21/28575* (2013.01); *H01L 29/452* (2013.01);
(Continued)

(58) Field of Classification Search
CPC ......... H01L 29/66431; H01L 29/66462; H01L 29/778–29/7789
See application file for complete search history.

(56) References Cited

U.S. PATENT DOCUMENTS 4,680,612 A * 7/1987 Hieber ............. H01L 23/53223
257/751
8,507,920 B2 * 8/2013 Chen et al. .................... 257/76
(Continued)

FOREIGN PATENT DOCUMENTS

WO 2013046943 A1 4/2013

OTHER PUBLICATIONS

Mohammed et al., 'First-layer Si metallizations for thermally stable and smooth Ohmic contacts for AlGaN/GaN high electron mobility transistors,' 2007 J. Vac. Sci. Tech B, vol. 25 No. 2, pp. 324-333.*
(Continued)

*Primary Examiner* — Bryan Junge
(74) *Attorney, Agent, or Firm* — McDonnell Boehnen Hulbert & Berghoff LLP

(57) ABSTRACT

The disclosure relates to a method for manufacturing an Au-free ohmic contact for an III-nitride (III-N) device on a semiconductor substrate and to a III-N device obtainable therefrom. The III-N device includes a buffer layer, a channel layer, a barrier layer, and a passivation layer. A 2DEG layer is formed at an interface between the channel layer and the barrier layer. The method includes forming a recess in the passivation layer and in the barrier layer up to the 2DEG layer, and forming an Au-free metal stack in the recess. The metal stack comprises a Ti/Al bi-layer, with a Ti layer overlying and in contact with a bottom of the recess, and a Al layer overlying and in contact with the Ti layer. A thickness ratio of the Ti layer to the Al layer is between 0.01 to 0.1. After forming the metal stack, a rapid thermal anneal is performed. Optionally, prior to forming the Ti/Al bi-layer, a silicon layer may be formed in contact with the recess.

19 Claims, 3 Drawing Sheets

(51) Int. Cl.
*H01L 29/778* (2006.01)
*H01L 29/66* (2006.01)
*H01L 29/417* (2006.01)
*H01L 29/20* (2006.01)

(52) U.S. Cl.
CPC .... *H01L 29/66462* (2013.01); *H01L 29/7783* (2013.01); *H01L 29/7786* (2013.01); *H01L 29/2003* (2013.01); *H01L 29/41766* (2013.01)

(56) References Cited

U.S. PATENT DOCUMENTS

| | | | |
|---|---|---|---|
| 2005/0189651 A1* | 9/2005 | Hirose | H01L 21/28575 257/745 |
| 2007/0051978 A1* | 3/2007 | Mita et al. | 257/194 |
| 2009/0194790 A1 | 8/2009 | Sato et al. | |
| 2011/0049720 A1 | 3/2011 | Jordan | |
| 2011/0269308 A1* | 11/2011 | Kansaku | 438/653 |
| 2011/0272742 A1* | 11/2011 | Akiyama et al. | 257/194 |
| 2013/0056746 A1* | 3/2013 | Joshin | 257/76 |
| 2013/0105863 A1* | 5/2013 | Lee et al. | 257/194 |
| 2016/0056040 A1* | 2/2016 | Tanaka | H01L 21/0485 438/602 |

OTHER PUBLICATIONS

Lee, Hyung-Seok et al., "AlGaN/GaN High-Electron-Mobility Transistors Fabricated Through a Au-Free Technology", IEEE Electron Device Letters, vol. 32, No. 5, May 2011, pp. 623-625.
Alomari, M. et al., "Au Free OHMIC Contacts for High Temperature InAlN/GaN HEMT's", ECS Transactions, vol. 25, No. 12, pp. 33-36, 2009, pp. 33-36.
Malmros, A. et al., "Electrical Properties, Microstructure, and Thermal Stability of Ta-Based OHMIC Contacts Annealed at Low Temperature for GaN HEMTs", Semicond. Sci. Technol., vol. 26, Mar. 31, 2011, pp. 1-7.
European Search Report for application No. EP 14168567 dated Oct. 1, 2014.
Desmaris, Vincent et al., "Transmission Electron Microscopy Assessment of the Si Enhancement of Ti/Al/Ni/Au Ohmic Contacts to Undoped AlGaN/GaN Heterostructures", Journal of Applied Physics, American Institute of Physics, vol. 100, No. 3, Aug. 2, 2006, p. 24904-1-4.
Soohwan Jang, et al., Si-Diffused GaN for Enhancement-Mode GaN MOSFET on Si Applications, Journal of Electronic Materials, vol. 35. No. 4, 2006, pp. 685-690.
C.F. Lin, et al., Improved contact performance of GaN film using Si diffusion, Applied Physics Letters, vol. 76, No. 14, Apr. 3, 2000, pp. 1878-1880.

\* cited by examiner

LOW TEMPERATURE OHMIC CONTACTS FOR III-N POWER DEVICES

CROSS-REFERENCE TO RELATED APPLICATIONS

This application claims priority to European Patent Application No. 13168720.4 filed on May 22, 2013, and European Patent Application No. 14151939.7 filed on Jan. 21, 2014, the contents of which are hereby incorporated by reference

BACKGROUND

The present disclosure relates to Au-free, low temperature ohmic contacts for III-N power devices on semiconductor substrates and a method of manufacturing thereof.

A GaN-based high electron mobility transistor (HEMT) technology offers perspectives for power device performance beyond known Si limitations. However, such devices are today fabricated on small diameter wafers, and often on sapphire or SiC substrates. To reduce fabrication costs, GaN HEMT power devices could be fabricated on standard Si substrates in high-productivity CMOS production facilities.

GaN HEMT device integration in a Si CMOS platform involves, among other challenges, the implementation of Au-free metallization schemes for source/drain ohmic contacts. A typical metallization scheme includes the deposition of a metal stack directly on top of an AlGaN layer, followed by an anneal step at a sufficiently high temperature to form a metal/AlGaN alloy. In addition, prior to the metal stack deposition, one or several treatments (wet clean, exposure to a plasma, recess etching, n-dopant implantation or diffusion, MOCVD regrowth of a highly n-doped layer in the ohmic areas, and the like) can be applied to the AlGaN/GaN HEMT epi layer. Typically, successful metallization schemes have been using Au-containing metal stacks annealed at relatively high temperatures ($\geq 800°$ C.); achieving typical contact resistance ($R_c$) values below 1 Ωmm.

In recent years, several Au-free contact schemes have been proposed, aiming at similarly low $R_c$. Frequently cited metallization schemes are Ti/Al-based ones, such as Ti/Al/W published by H. S. Lee et. al. in IEEE Electron Device Letters Vol. 32, nr. 5, pp. 623-625 (2011) and Ti/Al/Ni published by M. Alomari et al. in ECS Transactions, Vol. 25, nr. 12, pp. 33-36 (2009). In these cases, $R_c$ below 1.0 Ωmm has only been demonstrated at relatively high annealing temperatures ($\geq 800°$ C.).

Low $R_c$ and low annealing temperature for Au-free schemes have also been published, but typically employ metal schemes not directly compatible with CMOS platforms, for example, using a Ta/Al metal stack, $R_c$ of 0.06 Ωmm has been reported by A. Malmros et al. in Semicond. Sci. Technol. Vol. 26, p. 075006 (2011). The latter is not directly compatible with CMOS platforms, because Ta is only available in aggressively scaled submicron CMOS technologies typically on a shared Ta/Cu metallization platform to reduce the resistance of the CMOS interconnect layers and hence the RC delay. Using Ta in the ohmic metallization would for this reason result in Cu-contaminated wafers and extra process steps would be needed to remove the Cu-contaminants from the wafer backside, thereby enhancing the cost of the product. Alternatively, low $R_c$ values were obtained with introduction of Si doping in the GaN and/or AlGaN layer. This, however, can cause problems for the breakdown voltage of power devices, and Si implantations in GaN-based layers typically require annealing at very high temperatures (>1000° C.), not compatible with the process flow.

SUMMARY

The present disclosure relates to a method for manufacturing Au-free ohmic contacts for an III-N device and a III-N device obtained thereof as described in the appended claims.

In accordance with an embodiment, a method for manufacturing an Au-free ohmic contact for a III-N device includes providing a semiconductor substrate with a buffer layer, a channel layer, a barrier layer, and a passivation layer formed thereon, and a two-dimensional electron gas (2DEG) layer formed at an interface between the channel layer and the barrier layer. The method also includes forming a recess at least extending through the passivation layer and forming an Au-free metal stack in the recess. The metal stack includes a Ti/Al bi-layer, with a Ti layer overlying and in contact with a bottom of the recess, and an Al layer overlying and in contact with the Ti layer. A thickness ratio of the Ti layer to the Al layer is between 0.01 to 0.1. Further, after forming the Au-free metal stack, an anneal is performed thereby forming the Au-free ohmic contact.

In accordance with an embodiment, an intermediate structure in the process of manufacturing a III-nitride device having an Au-free ohmic contact is disclosed. The intermediate structure includes a semiconductor substrate, a III-nitride heterostructure on the semiconductor substrate, a passivation layer on the III-nitride heterostructure, and an Au-free metal stack for forming an ohmic contact. The Au-free metal stack includes a Ti/Al bi-layer having a Ti layer and an Al layer overlying and in contact with the Ti layer. A thickness ratio of the Ti layer to the Al layer is between 0.01 to 0.1.

In accordance with an embodiment, a III-nitride device obtainable from the intermediate structure described above (and elsewhere herein), further includes an Au-free ohmic contact formed from the metal stack comprising the Ti/Al bi-layer.

BRIEF DESCRIPTION OF THE DRAWINGS

All drawings are intended to illustrate some aspects and embodiments of the present disclosure. The drawings described are only schematic and are non-limiting.

DETAILED DESCRIPTION

Figure 1:
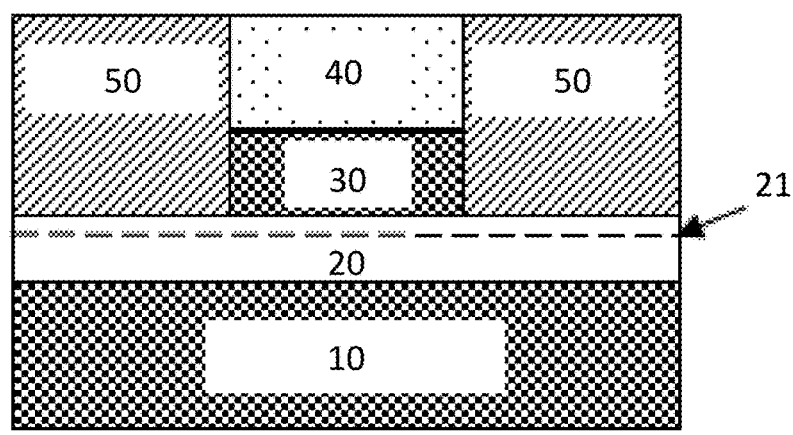
FIG. 1 schematically illustrates recessed ohmic contacts according to embodiments of the disclosure.

The present disclosure relates to the fabrication of Au-free ohmic contacts for III-N power devices using a Ti/Al-comprising metal stack having a contact resistance lower than those reported in the literature.

Further, the present disclosure relates to the fabrication of Au-free ohmic contacts for AlGaN/GaN power devices using a Ti/Al-comprising metal stack having a contact resistance lower than 1 Ωmm.

Specific embodiments of the disclosure disclose Ti/Al bi-layers with a contact resistance of about 0.62 Ωmm and a method of manufacturing thereof. Advantageously, the method of the disclosure may employ alloy temperatures as low as 550° C. or lower.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, and the like in the description, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, under, and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

In a first aspect the present disclosure, a method for manufacturing an Au-free ohmic contact for a III-N device includes providing a semiconductor substrate, and thereon a buffer layer, a channel layer, a barrier layer, and a passivation layer. A two-dimensional electron gas (2DEG) layer may be formed at the interface between the channel layer and the barrier layer. The method also includes forming a recess in the passivation layer and/or (partially) in the barrier layer and/or partially in the channel layer, thereby reaching respectively close to or up to or past the 2DEG layer. Further, the method includes forming an Au-free metal stack in the recess, wherein the metal stack comprises a Ti/Al bi-layer, with a Ti layer overlying and in contact with a bottom of the recess and an Al layer overlying and in contact with the Ti layer. A thickness ratio of the Ti layer to the Al layer may be from between about 0.01 to 0.1. In the present example, after forming the metal stack, the method includes performing an anneal, such as a rapid thermal anneal.

Before forming the Ti/Al bi-layer in the recess, a silicon layer may be formed at least at and in contact with a bottom of the recess. In one example, this silicon layer has a thickness above zero up to 50 nm, such as between 2 and 20 nm.

In the Ti/Al bi-layer, the Al layer may have a thickness of 50-200 nm. In addition, the deposition temperature of the Al may be between room temperature and 450 C. In the Ti/A; bi-layer, the Ti layer may have a thickness corresponding to a Ti/Al ratio of 0.01 to 0.1, such as between 0.02 to 0.08, or between 0.03 and 0.06.

In embodiments of the disclosure, the Au-free metal stack may or may not comprise a further metal layer overlaying and in contact with the Ti/Al bi-layer. The further metal layer may include at least one metal selected from the group consisting of Ti, TiN, Cu, and W. This further metal layer is typically added, not to obtain the ohmic contact that is formed by the Si/Ti/Al, but for other reasons, such as to facilitate lithography processing, to avoid oxidation of the Al top layer, or to lower the metal resistance.

The further metal layer may include or consist of one layer on top of the Ti/Al bi-layer, such as in the following examples: Ti/Al/TiN or Ti/Al/W. Alternatively, the further metal layer can be a multi-layer comprising, for example, two layers, such as in the following examples: Ti/Al/Ti/TiN or Ti/Al/Ti/W.

The anneal process, which is also referred to herein as alloy formation, may be performed in an inert atmosphere or in the presence of a forming gas. Examples of an inert atmosphere include but are not limited to $N_2$.

In different embodiments, the anneal is performed at a temperature from 450° C. to 650° C. The latter, also referred to as alloy temperature, is substantially lower than the alloy temperatures known in the art for Au-free ohmic contacts. In another example, the anneal may be performed at a temperature between 500° C. and 550° C.

In embodiments of the disclosure, the semiconductor substrate may include silicon, SiC, or sapphire. In particular examples, the semiconductor substrate may be a silicon wafer. Further, the buffer layer may comprise a plurality of sub-layers, and each of the sub-layers may comprise Al and/or Ga, and N, for example, AlGaN. In addition, a nucleation layer can be present at the interface between the semiconductor substrate and the buffer layer. Further, the channel layer may include GaN and the barrier layer may include AlGaN. In addition, a capping layer may be present overlying and in contact with the barrier layer.

In embodiments of the disclosure, the passivation layer comprises SiN, AlN, AlSiN, $Al_2O_3$, $SiO_2$, SiC, and/or SiCN. Further, the passivation layer may include or consist of Low Pressure Chemical Vapour Deposition (LPCVD) SiN, Rapid Thermal Chemical Vapour Deposition (RTCVD) SiN, Plasma-enhanced Atomic Layer Deposition (PEALD) SiN, or in-situ (MOCVD) SiN.

Prior to forming the metal stack, a wet clean is may be performed to prepare the exposed surface of the recess for the metal deposition. The wet clean may be performed with a chemical solution comprising at least one of HCl, HF, BHF, TMAH, $NH_4OH$, or a mixture (applied simultaneously) or combination (applied sequentially) thereof.

In specific embodiments of the disclosure, undoped AlGaN/GaN/AlGaN double heterostructure layers are grown on 200 mm Silicon wafers by Metal-Organic Chemical Vapor Deposition (MOCVD).

The symbols herein further refer to FIG. 1. On a Si substrate (not shown) a 200 nm-thick AlN nucleation layer (not shown) was first grown, followed by a buffer layer (10) comprised of 400 nm $Al_{0.75}Ga_{0.25}N$, 400 nm $Al_{0.44}Ga_{0.56}N$, and 1800 nm $Al_{0.2}Ga_{0.8}N$. Then a 150 nm-thick GaN channel (20) was grown followed by a thin AlN spacer (not shown) of about 1 nm and by $Al_{0.2}Ga_{0.8}N$ barrier (30) of about 15 nm. Finally, in the present example, a 2 nm GaN is used as capping layer (not shown).

A 150 nm-thick ex situ SiN passivation layer (40) was deposited by Rapid Thermal Chemical Vapor Deposition (RTCVD) at 700° C. This layer adequately passivates the GaN substrate surface and thereby avoids depletion of a 2-dimensional electron gas (2DEG) (21) that forms at the AlGaN/GaN interface. Alternatively, in other embodiments, the SiN passivation layer is formed in situ, e.g., in the same chamber/deposition platform with the III-nitride layers.

In embodiments of the disclosure the passivation layer is deposited before ohmic contact formation, then ohmic contact trenches are defined by etching through this passivation layer. As a result, the passivation layer is still present on the GaN substrate at the edge of the ohmic contact, and also 2DEG depletion is avoided at the edge of the ohmic contact. This allows the ohmic contact to be in intimate sideways contact with an un-depleted 2DEG, thereby allowing the use of contact annealing temperatures that are substantially lower with respect to those reported in the art. For comparison, in case the passivation layer is deposited after formation of the ohmic contact formation, step coverage issues (such as voids in the layer) at the bottom corner of the topography formed by the ohmic contact on the GaN substrate can lead to a locally unpassivated GaN substrate at the edge of the ohmic contact, and hence a depleted 2DEG at the edge of the ohmic contact.

The formation of ohmic contacts starts with a removal of the RTCVD nitride and the AlGaN barrier in the contact area down to the location of the 2DEG in the GaN channel as shown schematically in FIG. 1. An HCl-based clean is then carried out prior to the metal deposition. After metal stack deposition, an anneal at about 550° C. in $N_2$ ambient for 90 s completes the formation of the ohmic contact.

A CMOS-compatible metal stack (50) used for ohmic contacts may be composed of Ti (x nm)/Al (y nm), optionally with Ti (20 nm)/TiN (60 nm) on top the Al, where x and y were varied in different tests. In one example, Ti and TiN are sputtered at room temperature, while the Al is deposited at 350° C. The relative amount of Al in the Ti/Al stack plays a role in attenuating the aggressive Ti—GaN reaction, while excess Ti would lead to the formation of voids below the TiN.

Figure 2:
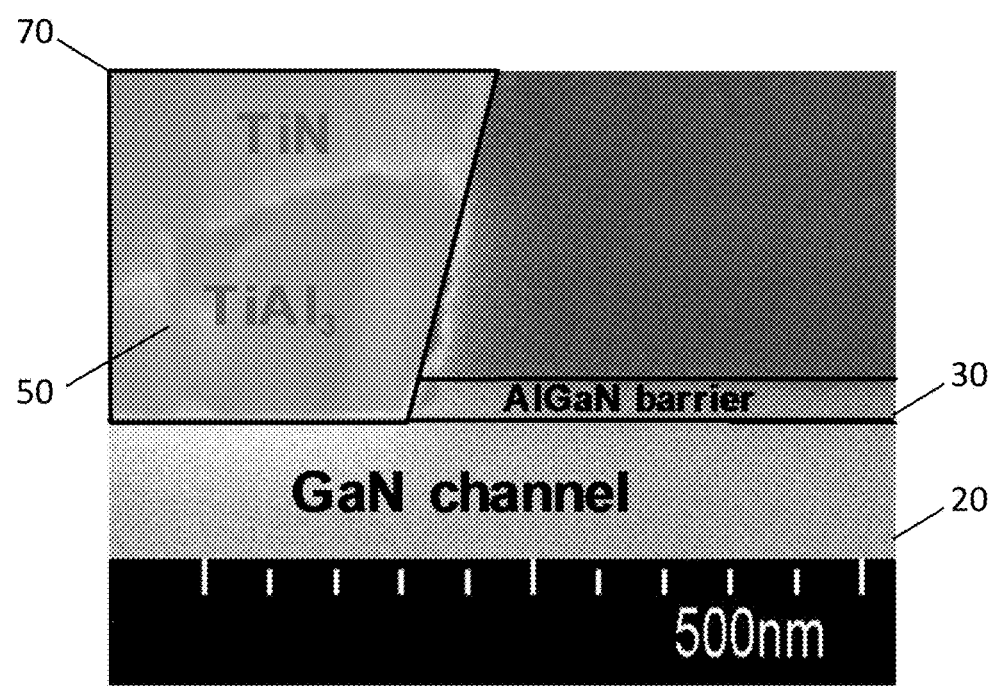
FIG. 2 shows a cross-section SEM image of ohmic contacts according to embodiments of the disclosure.

FIG. 2 shows a cross-section scanning electron microscopy (X-SEM) image of the recessed ohmic contact after alloy formation at 550° C. A smooth and sharp interface is observed between the contact and the GaN channel surface.

The 2DEG sheet resistance at the AlGaN/GaN interface was extracted on Van der Pauw structures and the value obtained was 400±10 Ω/sq over the full 200 mm wafer, resulting in a good quality and uniformity of the 2DEG.

Figure 3:
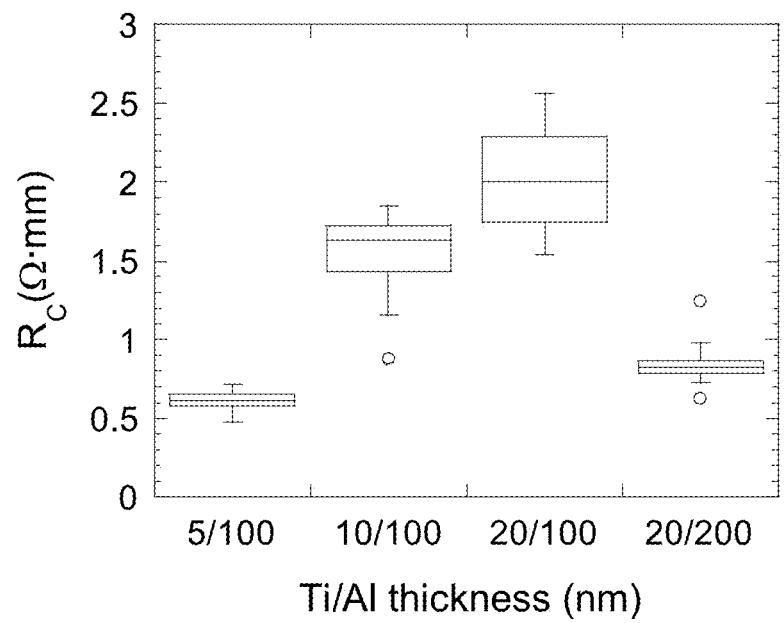
FIG. 3 shows contact resistance ($R_c$) values versus Ti/Al thickness according to embodiments of the disclosure.

In accordance with the present disclosure, Ohmic contacts were characterized with the standard transfer length method (TLM) technique. The box chart shown in FIG. 3 shows a median value and a spread over the 200 mm wafer for $R_c$ values obtained for different Ti and Al thicknesses in the ohmic metal stack.

It was found that certain ratios of the Ti/Al thickness are preferred since they result in lower $R_c$, with a minimum value of 0.62±0.06 Ωmm obtained when using 5 nm Ti and 100 nm Al in the metal stack.

Saturation of current through ohmic contacts to AlGaN/GaN HEMT layers has been investigated and different theories have been proposed as explanation, such as self-heating causing velocity saturation or the impact of surface traps acting as a 'virtual gate' depleting locally the 2DEG. Together with the extraction of $R_c$, current measurements were performed at 10 V on a single TLM pad.

Figure 4:
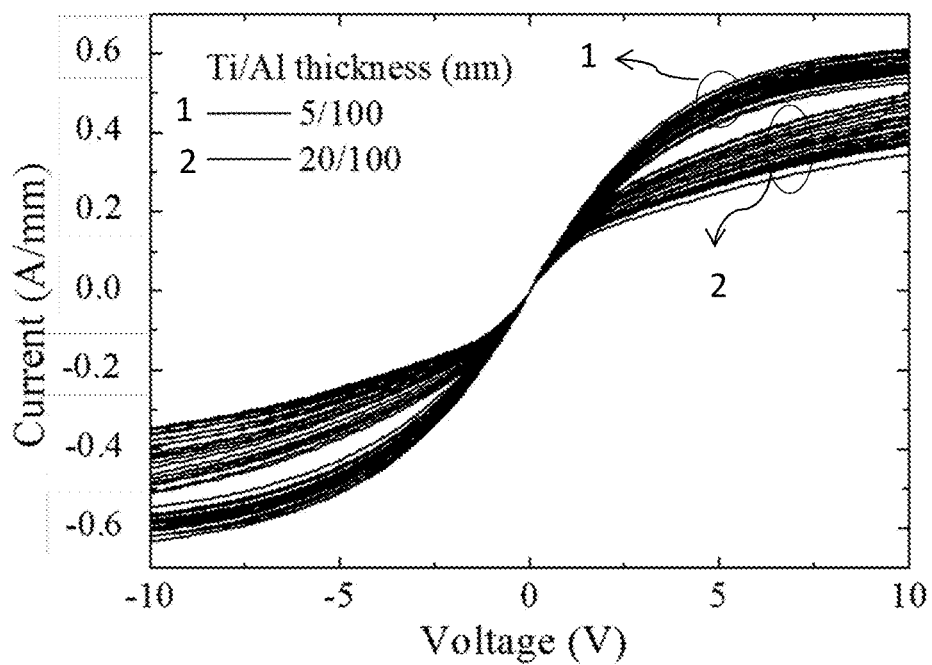
FIG. 4 shows I-V curves up to 10 V for contacts with low (according to embodiments of the disclosure) and high $R_c$ (comparative data), wherein a contact spacing was 12 μm.

In FIG. 4, I-V wafer mapping over the full 200 mm wafer up to 10 V for two wafers with different Ti/Al ratios are compared: (1) Ti/Al bi-layer thicknesses 5 nm Ti/100 nm Al; and (2) Ti/Al bi-layer thicknesses 20 nm Ti/100 nm Al. The sample with 5 nm/100 nm Ti/Al having the lowest $R_c$ (as shown in FIG. 3) is also showing a higher current at 10 V (about 0.6 A/mm) than the sample with 20 nm Ti/100 nm Al.

Figure 5:
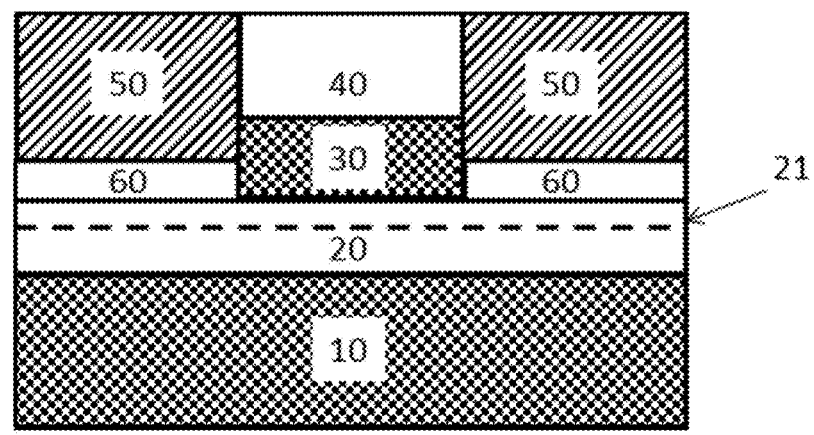
FIG. 5 schematically illustrates recessed ohmic contacts with Si interlayer according to embodiments of the disclosure.
Figure 6:
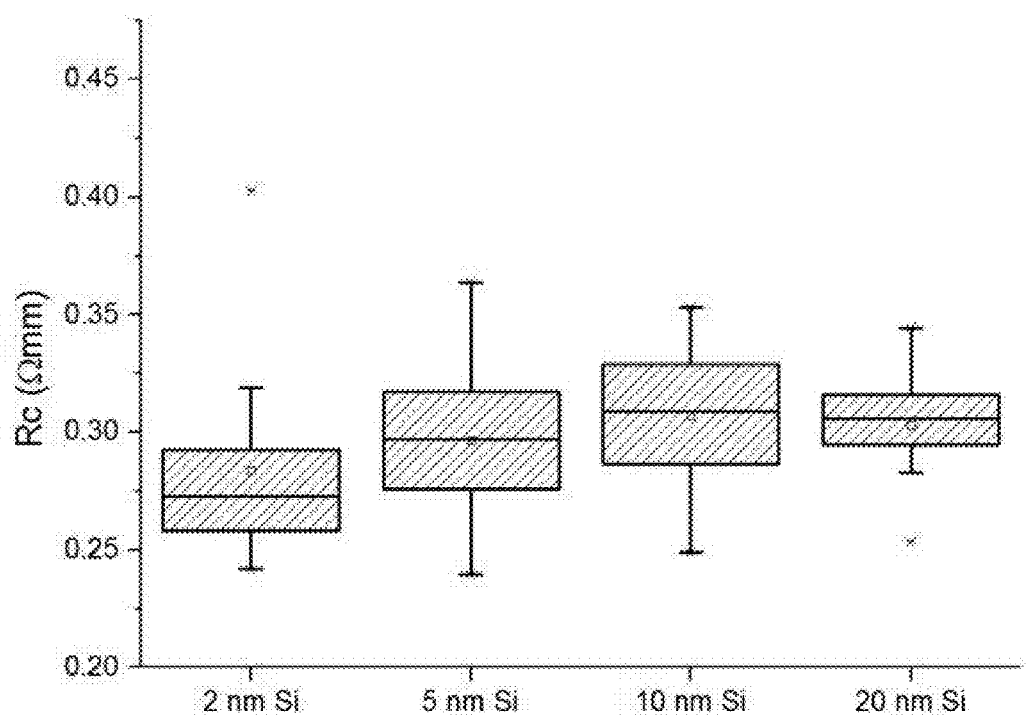
FIG. 6 shows contact resistance Rc (Ωmm) for different thickness of a silicon layer underneath a Ti/Al bi-layer in accordance with embodiments of the disclosure.

Optionally as shown in FIG. 5, in embodiments of this disclosure, a silicon layer (60) may be inserted in between the Ti/Al bi-layer (50) and a bottom of a recess (70). In the presented example, the Si layer may be deposited by CVD at 540° C., but the Si layer may also be deposited by sputtering.

The silicon layer impacts the alloying phase. Firstly, it will form an eutectic melt with the Al/Ti bi-layer in the metal stack. This eutectic melt has a lower melting temperature, allowing the Al diffusion to start at a lower temperature. The Al at the AlGaN barrier/metal interface will form a AlN interlayer. As there is competition for Nitrogen between the AlGaN barrier layer and the AlN interlayer, both layers will be deficient in N. The N-vacancies in AlN and AlGaN have the effect of n-type doping in the layers and will create a highly doped interface layer with a large amount of charge carriers, resulting in a low contact resistance Rc. Moreover, silicon is also an n-type dopant in the Al(Ga)N material system and, during the alloying phase, silicon could also contribute to an increase in the amount of charge carriers, further helping in reducing the contact resistance.

The device illustrated by FIG. 5 can be formed as follows. A recess (70) is patterned at least in the AlGaN barrier layer (30). The recess should preferably leave less than 5 nm of the barrier layer and this recess can extend up to 10 nm into the GaN channel layer (20). Using a wet clean or a plasma clean, the exposed surface of the patterned layers is cleaned thereby removing oxides and contamination. Then a silicon layer (60) is deposited. The processing window for the thickness of the silicon layer is large, for example, the silicon thickness can range from several nanometers to 10's of nanometers. After depositing the silicon layer (60), an optional surface cleaning can be performed to remove surface oxidation and contamination before depositing the metal stack comprising the Ti/Al bi-layer. This wet clean performed prior to forming the metal stack can be performed with a chemical solution comprising at least one of HCl, HF, BHF, TMAH, $NH_4OH$, or a mixture thereof. The wet clean can also involve sequentially applying these chemical solutions or combinations or mixtures thereof.

The formation of the metal stack can continue as discussed in the foregoing embodiments.

In FIG. 5 the contact resistance Rc of the Au-free ohmic contact is given for different thicknesses of the silicon layer formed underneath the Ti/Al stack. The thickness of the silicon layer may be varied from 2 nm to 20 nm for given conditions of the metal stack formation. The contact resistance is nearly insensitive to the Si thickness, with most measured values between 0.25 Ωmm to 0.35 Ωmm.

In a second aspect of the disclosure an intermediate structure in the process of manufacturing of an III-nitride device having Au-free ohmic contacts is disclosed. The intermediate structure includes a semiconductor substrate, a III-nitride heterostructure on the semiconductor substrate, a passivation layer on the III-nitride heterostructure, and a metal stack for forming ohmic contacts. In one example, the metal stack comprises a Ti/Al bi-layer including a Ti layer and an Al layer overlying and in contact with the Ti layer. A thickness ratio of the Ti layer to the Al layer is from 0.01 to 0.1, in accordance with one embodiment. Optionally, a silicon layer is present underneath the Ti/Al bi-layer.

The III-nitride heterostructure may also include, as described in the first aspect of the disclosure discussed above, a buffer layer, a channel layer, a barrier layer, and a passivation layer, with a 2DEG layer formed at an interface between the channel layer and the barrier layer.

For the different compositions of the metal stack and of the III-nitride layers and passivation layer, reference is made to those compositions disclosed in relation to the first aspect of the disclosure.

In a further aspect of the disclosure, a III-nitride device obtainable from the intermediate structure of the second aspect is disclosed. The III-nitride device comprises ohmic contacts formed by anneal from the metal stack comprising the Ti/Al bi-layer, which may be in contact with a silicon layer.

The anneal for alloy formation is applied at a temperature lower than those known in the art as disclosed in detail in the first aspect of the disclosure, followed by the subsequent process steps of a conventional manufacturing flow.

The invention claimed is:

1. A method for manufacturing an Au-free ohmic contact for a III-N device comprising:
    providing a semiconductor substrate and thereon a buffer layer, a channel layer, a barrier layer, and a passivation layer, wherein a two-dimensional electron gas (2DEG) layer is formed at an interface between the channel layer and the barrier layer;
    forming a recess at least extending through the passivation layer;
    forming a silicon layer at least at and in contact with a bottom of the recess;
    forming an Au-free metal stack in the recess after forming the silicon layer, wherein the metal stack includes a Ti/Al bi-layer, with a Ti layer overlying and in contact with the silicon layer, and an Al layer overlying and in contact with the Ti layer, wherein a thickness ratio of the Ti layer to the Al layer is between 0.01 to 0.1, and wherein the silicon layer forms a eutectic melt with the Ti/Al bi-layer; and
    after forming the Au-free metal stack, performing an anneal thereby forming the Au-free ohmic contact.

2. The method of claim 1, wherein the recess further extends into the barrier layer.

3. The method of claim 2, wherein the recess further extends into the channel layer.

4. The method of claim 1, wherein a thickness range of the silicon layer is from above 0 to 50 nm.

5. The method of claim 1, wherein the thickness ratio of the Ti layer to the Al layer is between 0.02 to 0.08.

6. The method of claim 5, wherein the Al layer has a thickness between 50 to 200 nm.

7. The method of claim 1, wherein a deposition temperature of the Al is less than 450° C.

8. The method of claim 1, wherein the metal stack further comprises a further metal layer overlaying and in contact with the Ti/Al bi-layer.

9. The method of claim 8, wherein the further metal layer comprises at least one metal selected from the group consisting of Ti, TiN, Cu, and W.

10. The method of claim 1, wherein the anneal is performed in an inert atmosphere or in a forming gas.

11. The method of claim 10, wherein the anneal is performed at a temperature between 450° C. to 650° C.

12. The method of claim 1, wherein the semiconductor substrate comprises silicon, SiC, or sapphire.

13. The method of claim 1, wherein the buffer layer comprises a plurality of sub-layers and each of the sub-layers comprises N and at least one of Al or Ga.

14. The method of claim 1, wherein the channel layer comprises GaN.

15. The method of claim 1, wherein the barrier layer comprises AlGaN.

16. The method of claim 1, wherein the passivation layer comprises at least one of SiN, AlN, AlSiN, Al2O3, or SiO2.

17. The method of claim 1, further comprising performing a wet clean prior to forming the metal stack, wherein the wet clean is performed with a chemical solution comprising at least one of HCl, HF, BHF, TMAH, or NH4OH.

18. A structure comprising:
    a semiconductor substrate;
    a buffer layer, a channel layer, a barrier layer, a two-dimensional electron gas (2DEG) layer at an interface between the channel layer and the barrier layer, and a passivation layer;
    a silicon layer overlying and in contact with the 2DEG layer;
    an Au-free metal stack for forming an ohmic contact, wherein the Au-free metal stack includes a Ti/Al bi-layer having a Ti layer overlying and in contact with the silicon layer and an Al layer overlying and in contact with the Ti layer, wherein a thickness ratio of the Ti layer to the Al layer is between 0.01 to 0.1,
    wherein the silicon layer forms a eutectic melt with the Ti/Al bi-layer.

19. A III-nitride device including the structure of claim 18, further comprising an Au-free ohmic contact formed from the metal stack comprising the Ti/Al bi-layer.

* * * * *